(12) United States Patent
Devos et al.

(10) Patent No.: US 12,164,004 B2
(45) Date of Patent: Dec. 10, 2024

(54) DIAGNOSTIC PROCESS FOR DETECTING ERRORS IN MOTOR CABLING FOR A THREE PHASE MOTOR DRIVEN BY A SOFT STARTER DEVICE

(71) Applicant: Schneider Toshiba Inverter Europe SAS, Pacy sur Eure (FR)

(72) Inventors: Thomas Devos, Carrières sous Poissy (FR); Simon Gervais, Gommecourt (FR); Saïd Talbi, Amiens (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 145 days.

(21) Appl. No.: 18/102,104

(22) Filed: Jan. 27, 2023

(65) Prior Publication Data
US 2023/0243889 A1 Aug. 3, 2023

(30) Foreign Application Priority Data
Feb. 2, 2022 (EP) .................................... 22305115

(51) Int. Cl.
*G01R 31/34* (2020.01)

(52) U.S. Cl.
CPC .................................. *G01R 31/346* (2013.01)

(58) Field of Classification Search
USPC .................................................... 324/765.01
See application file for complete search history.

(56) References Cited

U.S. PATENT DOCUMENTS

| 6,038,114 A | 3/2000 | Johnson |
| 2007/0013326 A1 | 1/2007 | Kling et al. |
| 2008/0088990 A1 | 4/2008 | Malrait et al. |
| 2010/0327790 A1* | 12/2010 | Nolemo .................... H02P 3/18 318/430 |

OTHER PUBLICATIONS

European Search Report and Search Opinion dated Jul. 25, 2022 for corresponding European Patent Application No. EP22305115.2, 5 pages.

* cited by examiner

*Primary Examiner* — Farhana A Hoque
(74) *Attorney, Agent, or Firm* — Locke Lord LLP

(57) ABSTRACT

A diagnostic process for a cabling of a three phase motor in a "delta-inside" configuration with a soft starter to a three phases power supply including, after cabling a soft starter with the thyristor outputs of the soft starter to the motor windings inputs, cabling the motor windings outputs to the main phases and powering the power supply or prior to startup of the motor, at least a test process including: measuring with voltage sensors, connected to the Mains inputs, voltage sensors connected to the motor outputs of the thyristors of the soft starter and observer functions within the soft starter the frequency, voltage and phase angle of the Mains and motor lines in order to compare such voltages and phases without triggering the thyristors; calculating the differential angle $\Delta\theta$ between the motor electric rotation angle $\theta_M$ and the Mains rotation angle $\theta_A$; comparing the calculated differential angle $\Delta\theta$ with known differential angles corresponding to a correct cabling differential angle and faulty cablings differential angles in test process steps to determine the status of the cabling, and wherein a result of the test process steps is displayed to show the status of the cabling.

15 Claims, 10 Drawing Sheets

DIAGNOSTIC PROCESS FOR DETECTING ERRORS IN MOTOR CABLING FOR A THREE PHASE MOTOR DRIVEN BY A SOFT STARTER DEVICE

FIELD OF THE INVENTION

The present disclosure concerns a process for detecting errors in the cabling between three phase Mains, a soft starter and a three phase motor and more precisely to diagnose a wrong wiring of a "delta-inside" wiring of a three phase motor connected to a soft starter device.

BACKGROUND

An asynchronous electric motor with three phases can be controlled by a starter device, mainly a soft starter device, in several ways. The cabling between the three phases of the motor and the starter device can notably be configured in a "Y" configuration that is three phases plus neutral or a 'delta' configuration. In the delta configuration, a configuration "line-delta" and a configuration called "delta-inside" are both possible.

In the configuration "line-delta", the thyristors of the starter device are connected to the summits of the three branches of the delta configuration of the windings of the motor.

In the "delta-inside" configuration such as in FIG. 1 the thyristors T1, T2, T3 of the starter are located inside the branches of the delta of the motor windings U, V, W. This has the consequence that there are six cables to be connected as disclosed in FIG. 2. Three cables connect the outputs of the soft starter device 2 to the inputs of the motor 3 and three cables allow the outputs of the motor to be fed back onto the three phases of the Mains electrical supply network 1 connected to the inputs of the soft starter.

This configuration is simple to produce, however when the motor and the soft starter device are not close to one another, cabling errors are common. One of the errors consists, for example, in inverting two phases. Another error consists, for example, in short-circuiting one or more windings of the motor. In such case, the winding is looped back on itself.

Document US2008/0088990 A1 provides a method for controlling an asynchronous electric motor comprising three windings distributed over three branches in a delta configuration, the motor being controlled by a soft starter device comprising power semiconductors directly connected in series with the three branches of the delta configuration of the windings of the motor. The method comprises application of a voltage in a first branch of the delta, after a priming delay, priming of the semiconductor of the first branch, measurement of the electrical current generated within the first branch during the priming operation, determination of the configuration of the cabling of the first branch as a function of the measured electrical current. The sequence is then repeated in the other branches if no overcurrent or undercurrent is measured in a previous branch. This method is an active method since it uses injecting currents in the branches to check the wiring.

Such active sequence method is efficient but may not be used by a client who needs only to test the cabling and does not want to inject currents in the motor phases.

SUMMARY OF THE INVENTION

The goal of the present disclosure is to provide a diagnostic process for detecting errors in a motor cabling of a delta-inside cabling of a soft starter and motor and more precisely to diagnose a wrong wiring of the delta wiring of such a three phase motor with soft starter connection without priming the semiconductors in the soft starter device and without injecting currents in the motor windings. The process comprises a passive diagnostic function which can be launched by an operator once it has done the wiring of the motor. This function may also be launched prior to a run order of the motor to check the wiring and to avoid possible peaks of current or wrong rotation direction at a motor run order.

More precisely, the present disclosure concerns a diagnostic process for detecting errors in a cabling of a three phase motor in a "delta-inside" configuration with a soft starter to a three phases power supply, comprising,
  after cabling a soft starter with the thyristor outputs of the soft starter to the motor windings inputs, cabling the motor windings outputs to the main phases and powering the power supply or prior to startup of the motor, at least a test process comprising:
  at least a step of measuring, with voltage sensors connected to the Mains inputs of the soft starter, with voltage sensors connected to the motor outputs of the thyristors of the soft starter and with observer means within the soft starter, the voltages or sign of the voltages and phase angles of the Mains and motor lines at the soft starter output in order to compare such voltages or sign of the voltages and phase angles without triggering said thyristors,
  at least a step of calculating the differential angle $\Delta\theta$ between the motor electric rotation angle $\theta_{motor}$ on the output side of the soft starter and the Mains electric rotation angle $\theta_{mains}$,
  at least a step of comparing the calculated differential angle $\theta_{diff}$ with known differential angles corresponding to a correct cabling differential angle and faulty cablings differential angles in a sequence of tests to determine the status of the cabling,
  and wherein results of the test process are displayed to show the status of said cabling.

Such a diagnostic process has the advantage of allowing to test the

The diagnostic process may comprise a test of presence of a run order in order to permit to start the motor, upon detection of a correct cabling.

In case $Dir_{mains}$, the Mains voltage rotation direction, is equal to the motor rotation direction $Dir_{motor}$ then the formula $$\theta_{diff}=\theta_{motor}-\theta_{mains}-\theta_{sync}+Dir_{motor}\times\theta_{vs}-Dir_{mains}\times\theta_{syncA}$$

may be applied,
or, in case $Dir_{mains}$ is not equal to the motor rotation direction $Dir_{motor}$ then the equation may be $$\theta_{diff} = \theta_{motor} + \theta_{mains} + \theta_{sync} + Dir_{motor} \times \theta_{Vs} + Dir_{mains} \times \theta_{SyncA} + \frac{(Dir_{motor} - Dir_{mains})}{2} \times \pi$$

In such alternatives $\theta_{sync}$ is an observer angle delay, $\theta_{syncA}$ is a Mains Voltage sign hardware measurement delay, $\theta_{vs}$ is a Motor Voltage sign hardware measurement delay introduced when the voltage measurement is limited to the sign of the voltage, where $Dir_{motor}=1$ when the three motor voltage phases rotate in direct direction and $Dir_{motor}=-1$ when said motor phase voltages rotate in reverse direction and where $Dir_{mains}=1$ when the three Mains voltage phases rotate in direct direction and $Dir_{mains}=1$ when they rotate in reverse direction.

The sequence of tests may be conducted on $\theta_{diff}$ value to determine the status of the cabling and the results of said tests may comprise diagnostic codes according to the determination of such status of the cabling.

A first test of said sequence may comprise checking whether a first condition C1 where $\theta_{diff}$ is greater than $$\frac{4\pi}{3} - \varepsilon$$

and lower than $$\frac{4\pi}{3} + \varepsilon$$

is satisfied, wherein, in case the result of such first test is positive, a display code for a correct wiring is emitted and a motor run order is executed when present, and wherein in case the result of such first test is negative a further test is executed or in case the firth test is the last test of the test sequence a display code wiring unknown is emitted.

A second test of said sequence may comprise checking whether a second condition C2 where $\theta_{diff}$ is greater than $$\frac{2\pi}{3} - \varepsilon$$

and lower than $$\frac{2\pi}{3} + \varepsilon$$

is satisfied, wherein, in case the result of said second test is positive a display code for a first reversed triangle condition is emitted and the process is stopped an wherein in case the result is negative a further test is executed or in case the second test is the last test of the test sequence a display code wiring unknown is emitted.

A third test of said sequence may comprise checking whether a third condition C3 where $\theta_{diff}$ is greater than $2\pi-\varepsilon$ and lower than $2\pi+\varepsilon$ is satisfied, wherein in case the result of said third test is positive a display code for a second reversed triangle condition is emitted and the process is stopped an wherein in case the result is negative a further test is executed or in case the third test is the last test of the test sequence a display code wiring unknown is emitted.

A fourth test of said sequence may comprise checking whether a fourth condition C4 where $\theta_{diff}$ is greater than $$\frac{5\pi}{3} - \varepsilon$$

and lower than $$\frac{5\pi}{3} + \varepsilon$$

is satisfied, wherein in case the result of said fourth test is positive a display code for a winding V looped back on itself is emitted and the process is stopped an wherein in case the result is negative a further test is executed or in case the fourth test is the last test of the test sequence a display code wiring unknown is emitted.

A fifth test of said sequence comprises checking whether a fifth condition C5 where $\theta_{diff}$ is greater than $\pi-\varepsilon$ and lower than $\pi+\varepsilon$ is satisfied, wherein in case the result of said fifth test is positive, a display code for a winding W looped back on itself is emitted and the process is stopped an wherein in case the result is negative a further test is executed or in case the fifth test is the last test of the test sequence a display code wiring unknown is emitted.

A sixth test of said sequence comprises checking whether a sixth condition C6 where $\theta_{diff}$ is greater than and lower than $$\frac{\pi}{3} - \varepsilon$$

and lower than $$\frac{\pi}{3} + \varepsilon$$

is satisfied, wherein in case the result of said fifth test is positive a display code for a winding U looped back on itself is emitted and the process is stopped an wherein in case the result is negative a further test is executed or in case the sixth test is the last test of the test sequence a display code wiring unknown is emitted.

In these tests, $\varepsilon$ is a limit error value which, as there is six possible values for $\theta_{diff}$, should have a maximal value of 30° as 360/6/2=30°. For convenience, $\varepsilon$ may be set between $$\frac{\pi}{6} \text{ and } \frac{\pi}{18}$$

allowing to have between ±30° and 10° angle tolerance around $\theta_{diff}$ and preferably $$\frac{\pi}{9}$$

corresponding to a 20° angle tolerance.

The diagnostic process may comprise at least a step of translating said display codes into plain language explanations and displaying said plain language explanations and/or a step of displaying said display code.

Depending on the size of an available display either display codes are displayed or plain language explanations are displayed.

The results of said test process may be transferred to a remote survey system or remote control device provided with display means for displaying said status of said cabling.

The diagnostic process may further comprise a test of presence of voltages ($V_U$, $V_V$, $V_W$) on the motor phases (U, V, W) prior to initiating a correct cabling test sequence.

The present disclosure concerns also a soft starter device comprising a processor, Mains voltage sensors on Mains inputs of motor control thyristors, motor voltage sensors on motor outputs of said thyristors, analog to digital conversion means associated to the processor for measuring the Mains phases voltages and the motor phase voltages, first observer means for measuring the Mains phases rotation angle, second observer means for measuring the motor phases rotation angle, said processor being further configured for implementing the diagnostic process of any one of the preceding claims upon receipt of a test order from a remote control device.

The present disclosure also concerns a software program configured for executing the disclosed diagnostic process when executed by a processor.

The present disclosure also concerns a non-volatile support on which such software program is recorded.

BRIEF DESCRIPTION OF THE DRAWINGS

A detailed description of exemplary embodiments of the invention will be discussed hereunder in reference to the attached drawings where.

DETAILED DESCRIPTION OF EMBODIMENTS OF THE INVENTION

Figure 1:
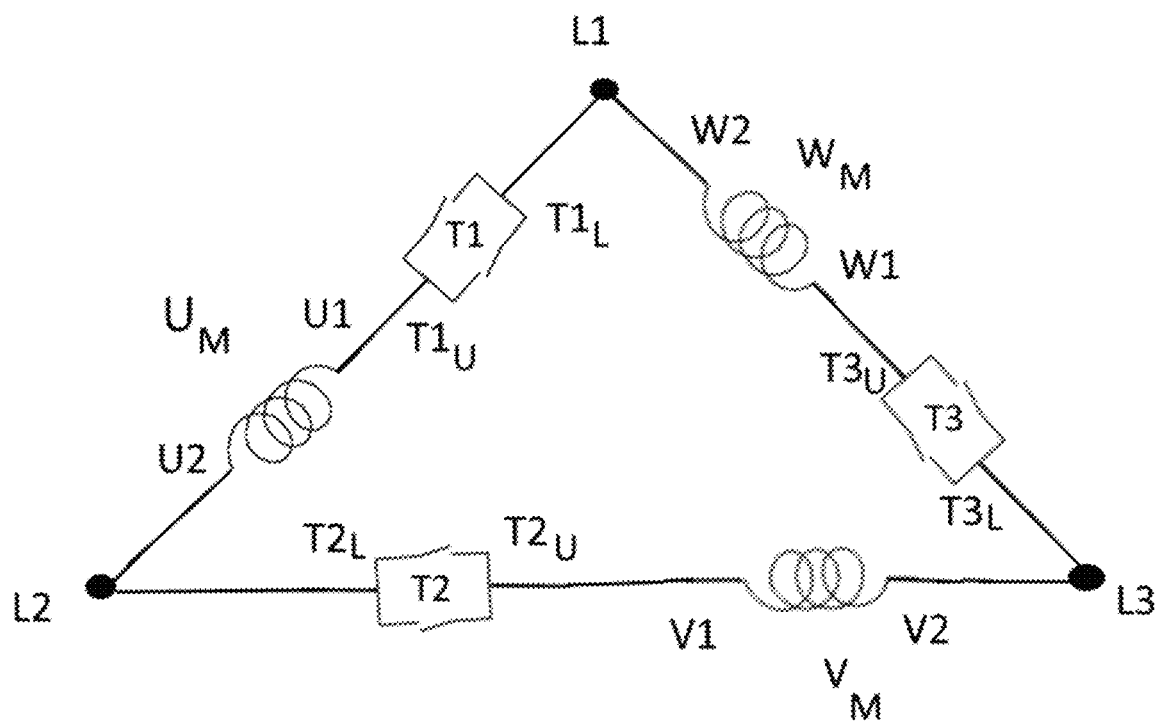
FIG. 1: shows the basic schematic of a "delta inside" wiring of a soft starter and motor.

As said above, FIG. 1 shows a delta-inside configuration of a motor with starter thyristors.

In such configuration, each motor winding $U_M$, $V_M$, $W_M$ is connected in series with a respective thyristor T1, T2, T3 so that branches ($U_M$, T1); ($V_M$, T2) and ($W_M$, T3) are created. The Power phases L1, L2, L3 are connected in triangle with said branches, the phase L1 is connected to thyristor T1 at T1L connection and winding $W_M$ at W2 connection, the phase L2 is connected to Thyristor T2 at $T2_L$ connection and winding $U_M$ at U2 connection and the phase L3 is connected to thyristor T3 at $T3_L$ connection and winding $V_M$ at V2 connection.

Figure 2:
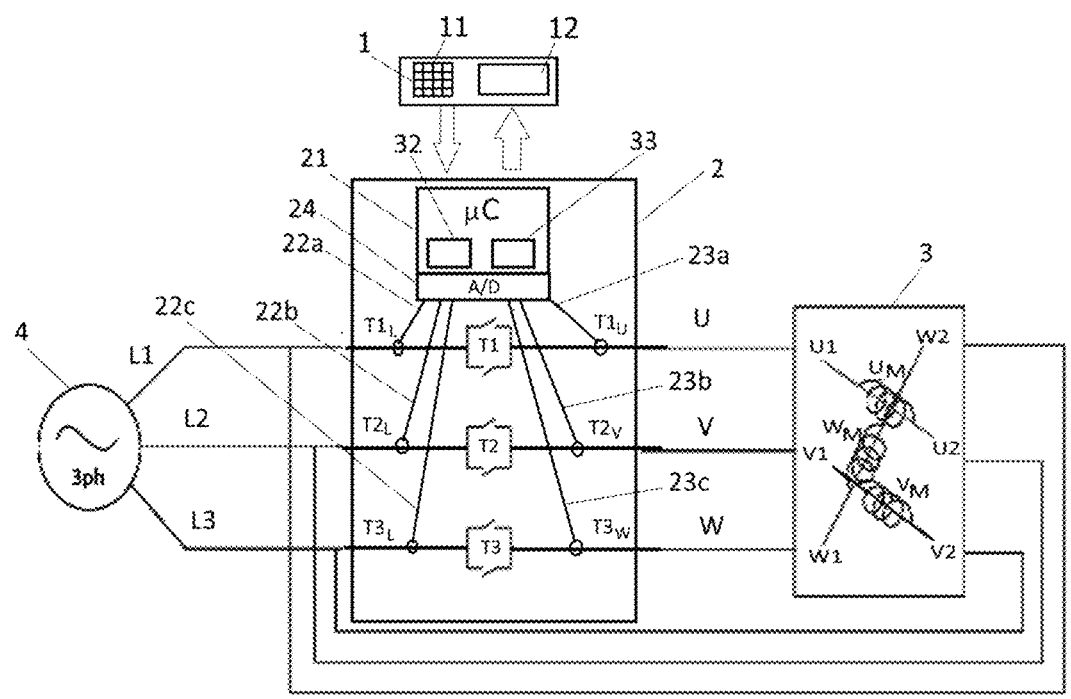
FIG. 2: shows an exemplary embodiment of a soft starter and cabling adapted to the process disclose herein.

FIG. 2 is a more detailed schematics where the thyristors T1, T2, T3 are shown in a soft starter device 2 comprising a microcontroller or processor 21 with a soft starter command line 1, analog inputs and digital power outputs adapted to provide a variable angle triggering signal for the motor 3 based on a synchronized triggering of thyristors T1, T2, T3 with the voltage of the Mains or power network connected to a power supply 1. The thyristors are used to obtain a progressive increase of voltage and current under control of the microcontroller 21 as known in the art.

The soft starter device 2 is under control of a controller 10 here having an input keyboard 11, for sending commands to the soft starter, and a display 12, the display 12 allowing to display information on the status of the soft starter and motor.

In the present disclosure, the microcontroller 21 is connected to voltage sensors 22a, 22b, 22c on the inputs T1L, T2L, T3L of the thyristors and comprises a first observer circuit or function 32 to measure the Mains phase $\theta_{mains}$ from the phases L1 L2 L3 on the three phase power supply 4 side. The microcontroller 21 is also connected to voltage sensors 23a, 23b, 23c on the outputs $T1_U$, $T2_V$, $T3_W$ of the thyristors and comprises a second observer circuit or function 33 to measure the motor phase $\theta_{motor}$ from the phases U, V, W, on the motor side.

Upon powering of the Mains phases L1, L2, L3, the microcontroller 21 is configured to measure a phase difference between $\theta_{mains}$ and $\theta_{motor}$ phases without initiating the thyristors T1, T2, T3 in order to characterize the good or bad cabling and allow to diagnostic the wiring fault origin.

Considering that cabling between the thyristors and motor is correct due to the simple coding of the outputs of the soft starter and motor winding terminals, there are six possible wiring combinations on the motor to Mains return wirings:
a) Correct cabling;
b) Triangle inversion (phase inversion) two possibilities;
c) All windings looped back on themselves;
d) One winding looped back on itself three possibilities.

Several cablings are shown in, FIGS. 3A to 3F in which are shown, the cabling arrangement, the schematics of such cabling, the circular representation of the rotation angles and the resulting differential angle $\theta_{diff}$ between the electrical motor rotation angle $\theta_{motor}$ and the Mains rotation angle $\theta_{mains}$. In, such circular representation, $\theta_A$ corresponds to the Mains angle mains and $\theta_M$ corresponds to the motor angle $\theta_{motor}$.

It should be noted that the circular representation is shown with voltage vectors $V_U$, $V_V$, $V_W$ Mains voltages and V1, V2, V3 Motor voltages in a same orthonormal representation and according to the same convention for measurements of Mains voltages and Motor voltages, that is phase to phase on both sides of the soft starter or phase to neutral on both sides of the soft starter. In case different measurements are done, e.g. is phase to phase on a first side and phase to neutral on the other side a $$\frac{\pi}{6}$$

addition or subtraction, depending on which measurement is done phase to phase and which measurement is done phase to neutral, has to be done to come back to the same representation. This would cause the following tests to consider this plus or minus $$\frac{\pi}{6}$$

value in the comparison depending on which voltage measurement is phase to phase and which voltage measurement is phase to neutral.

Another point is that the calculations are done modulo $2\pi$ and that in case the rotation direction between the motor and the Mains is reversed, the differential angle will be $\theta_{diff}=\theta_{Motor}-(\pi-\theta_{Mains})$.

Figure 3A:
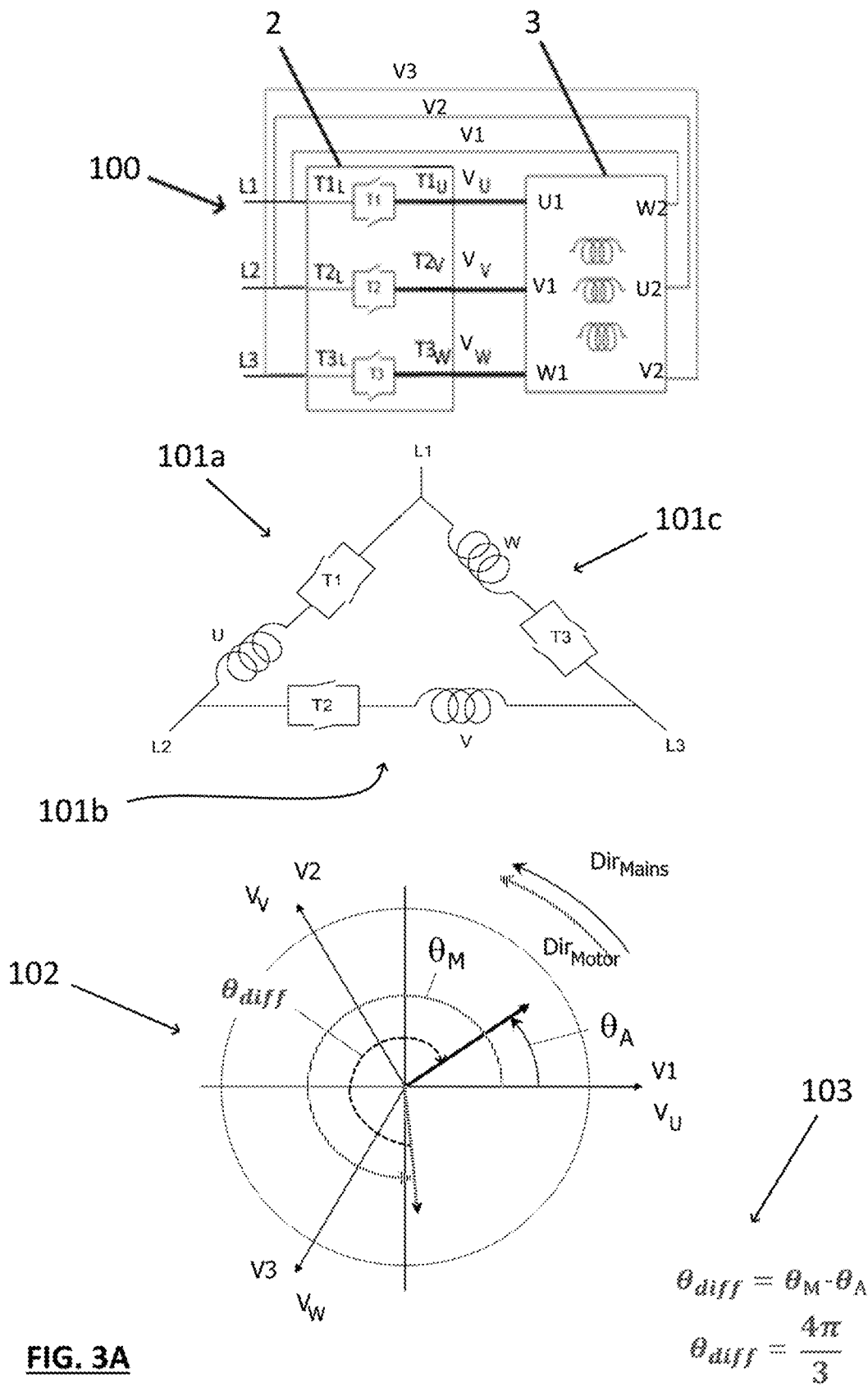
FIGS. 3A, 3B, 3C, 3D, 3E, 3F: show schematics and diagrams of respectively a correct cabling and faulty cablings of a "delta inside" motor cabling.

The correct cabling configuration a) is described in FIG. 3A. In such configuration as per the cabling schematic 100 between the soft starter 2 and the motor 3, the delta connection connects the branch ($U_M$, T1) 101a between phases L1, L2 of the power supply, the branch ($V_M$, T2) 101b between phases L2 and L3 and the branch ($W_M$, T3) 101c between phases L1 and L3.

In such case, the diagram 102 provides identical rotation direction between the motor Dir Motor and the power supply Dir$_{Mains}$. The differential angle between the electrical motor rotation angle $\theta_{motor}$ ($\theta_M$) and the Mains rotation angle $\theta_{mains}$($\theta_A$) is then as in 103:

$$\theta_{diff} = \frac{4\pi}{3}$$

Figure 3B:
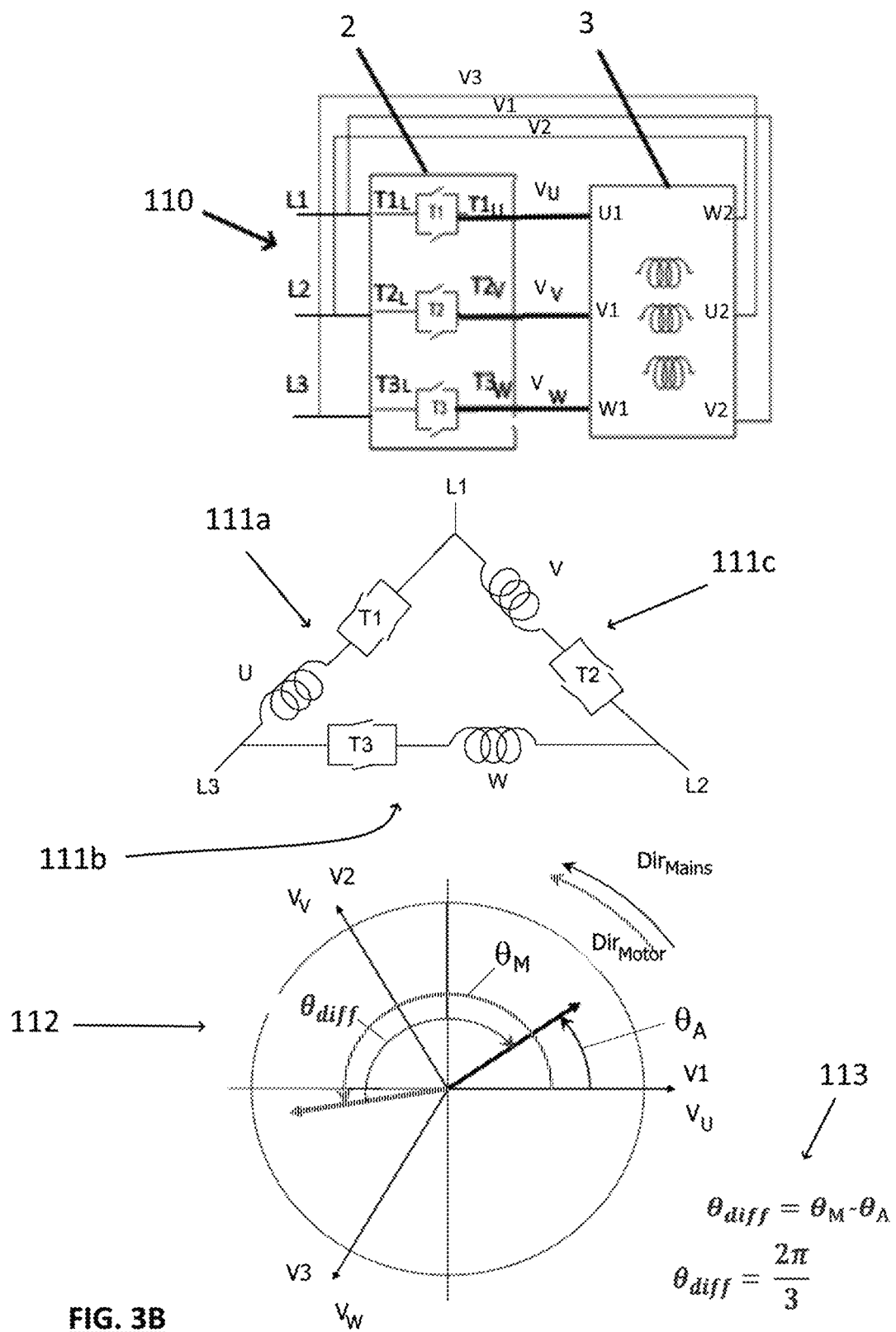

A first phase inversion configuration b) is described in FIG. 3B. In such configuration as per the cabling schematic 110, the delta connection connects the branch (U$_M$, T1) 111a between phases L1, L3 of the power supply, the branch (V$_M$, T2) 111b between phases L3 and L2 and the branch (W$_M$, T3) 111c between phases L2 and L1.

In such case, the diagram 112 provides identical rotation direction between the motor Dir$_{Motor}$ and the power supply Dir$_{Mains}$. The differential angle between the electrical motor rotation angle $\theta_{motor}$ and the Mains rotation angle $\theta_{mains}$ is then as in 113:

$$\theta_{diff} = \frac{2\pi}{3}$$

Figure 3C:
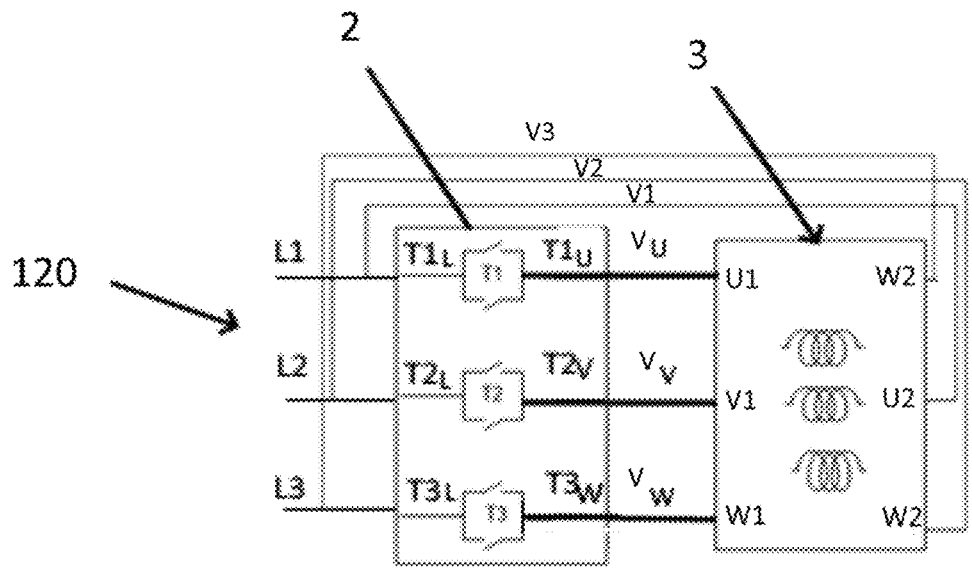
Figure 3C:
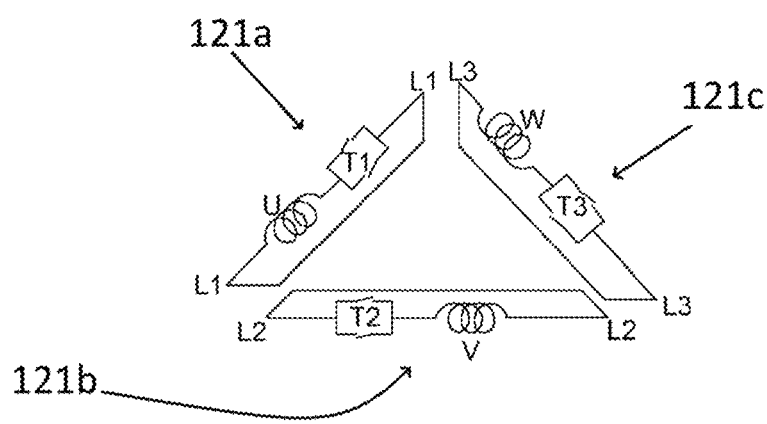
Figure 3C:
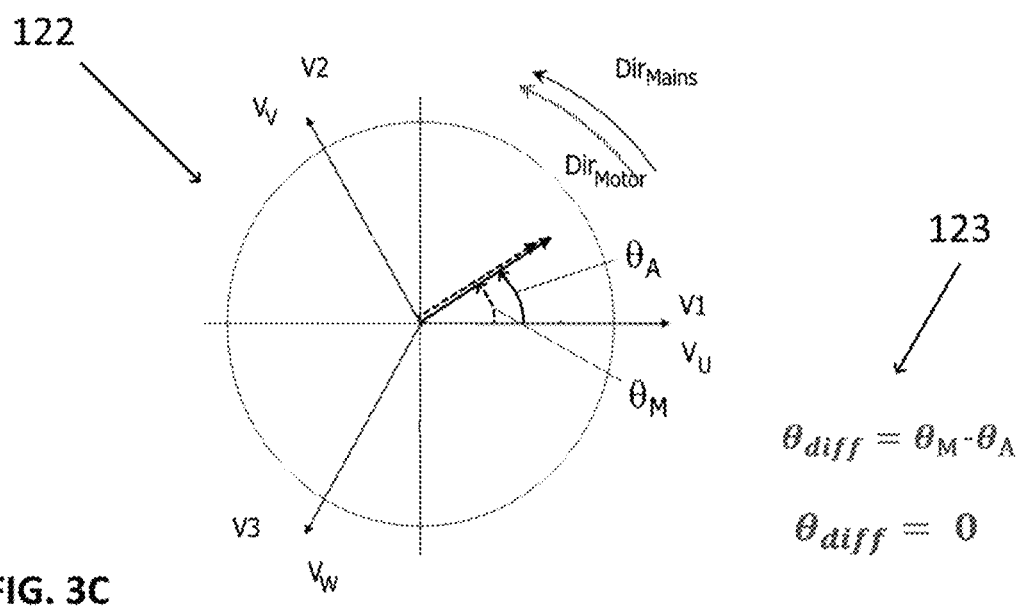

The all windings looped back on themselves configuration c) is described in FIG. 3C. In such configuration as per the cabling schematic 120, the branch (U$_M$, T1) 121a is looped back on itself and connected to phase L1 of the power supply, the branch (V$_M$, T2) 121b is looped back on itself and connected to phase L3 and the branch (W$_M$, T3) 121c is looped back on itself and connected to phase L3.

In such case, the diagram 122 provides identical rotation direction between the motor R$_M$ and the power supply R$_A$. However, rotation of the motor is not possible.

The differential angle between the electrical motor rotation angle $\theta_{motor}$ and the Mains rotation angle $\theta_{mains}$ is then as in 123:

$\theta_{diff}$=0

Figure 3D:
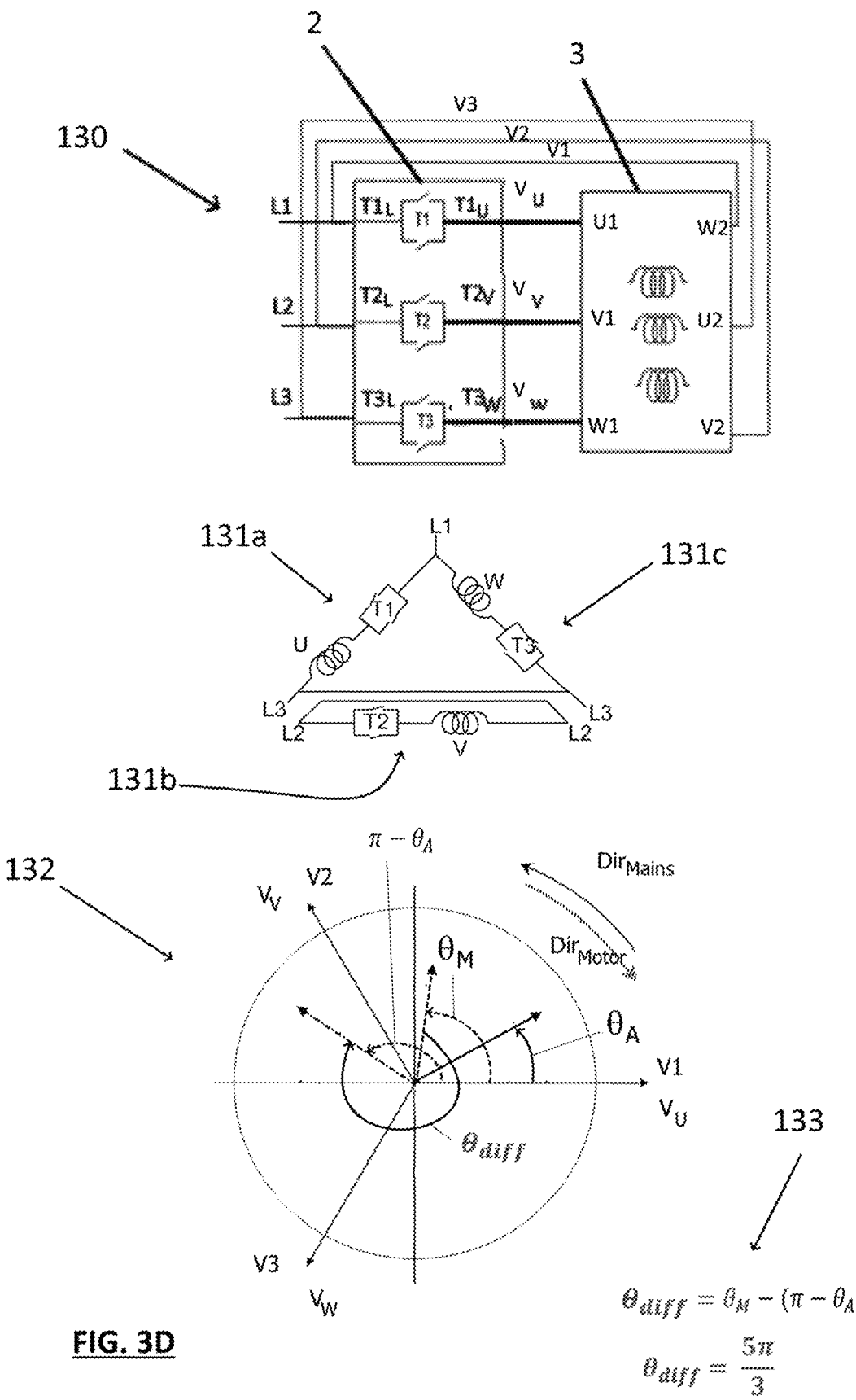

A first looped back on itself configuration d) where the branch (V$_M$, T2) 131b is looped back is described in FIG. 3D. In such configuration as per the cabling schematic 130, the branch (U$_M$, T1) is connected to L1, L3, the branch (V$_M$, T2) 131b is looped back on itself and connected to phase L2 and the branch (W$_M$, T3) 121c is connected between phases L1 and L3.

In such case, the diagram 132 provides reverse rotation direction between the motor R$_M$ and the power supply R$_A$. The differential angle between the electrical motor rotation angle $\theta_{motor}$ and the Mains rotation angle $\theta_{mains}$ is then as in 133:

$$\theta_{diff} = \frac{5\pi}{3}$$

Figure 3E:
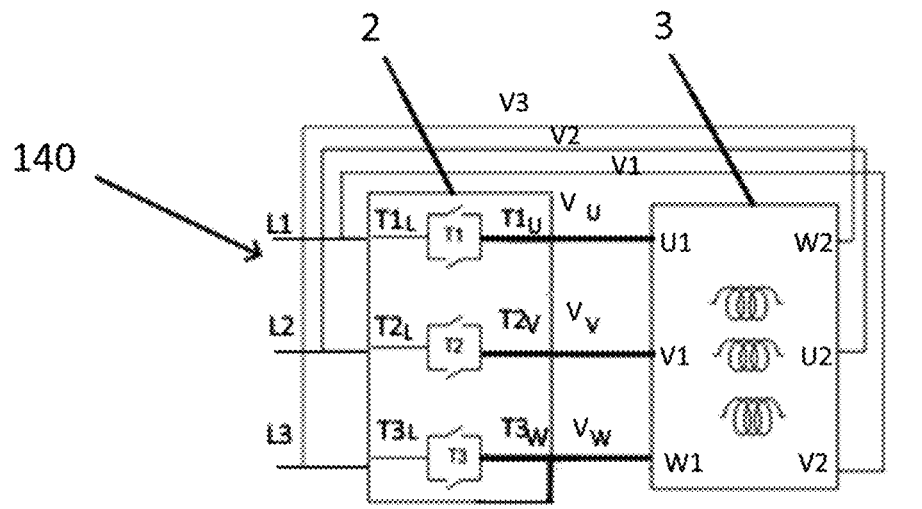
Figure 3E:
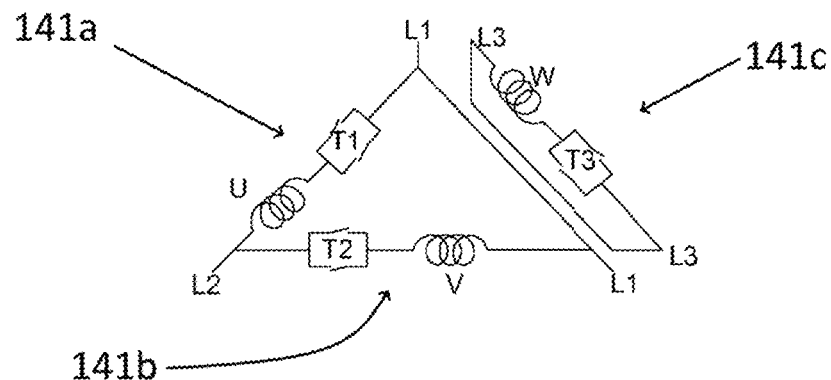
Figure 3E:
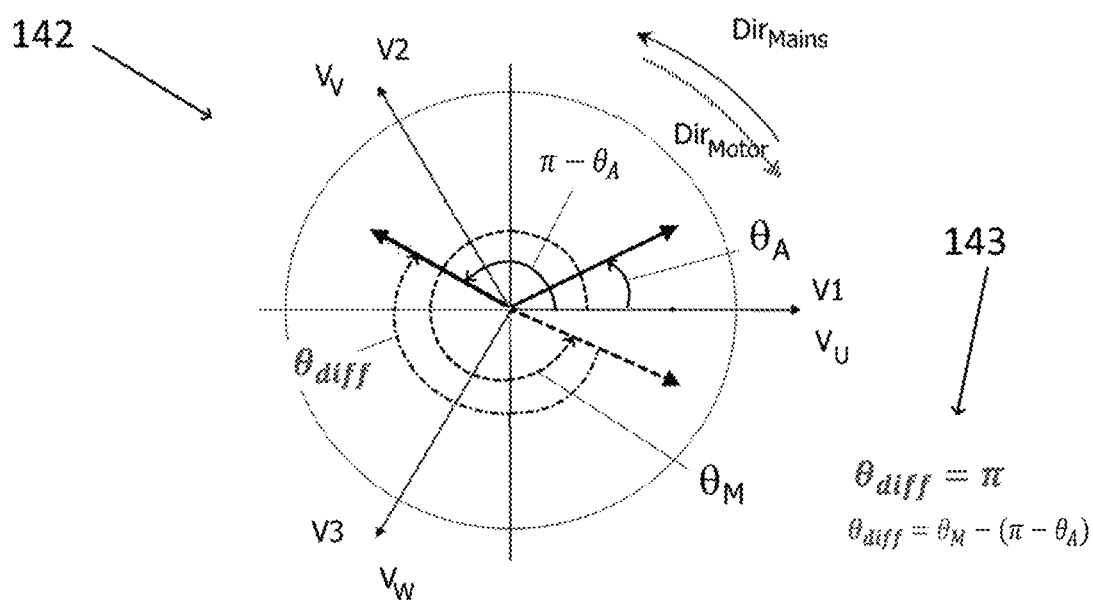

A second one winding looped back on itself configuration d) where the branch (W$_M$, T3) 141c is looped back on itself is described in FIG. 3E. In such configuration as per the cabling schematic 140, the branch (U$_M$, T1) is connected to L1, L2, the branch (V$_M$, T2) 141b is connected between phases L2 and L1 and the branch (W$_M$, T3) 141c is looped back on itself and connected to phase L3.

In such case, the diagram 142 provides reverse rotation direction between the motor R$_M$ and the power supply R$_A$.

The differential angle between the electrical motor rotation angle $\theta_{motor}$ and the Mains rotation angle $\theta_{mains}$ is then as in 143:

$\theta_{diff}$=π

Figure 3F:
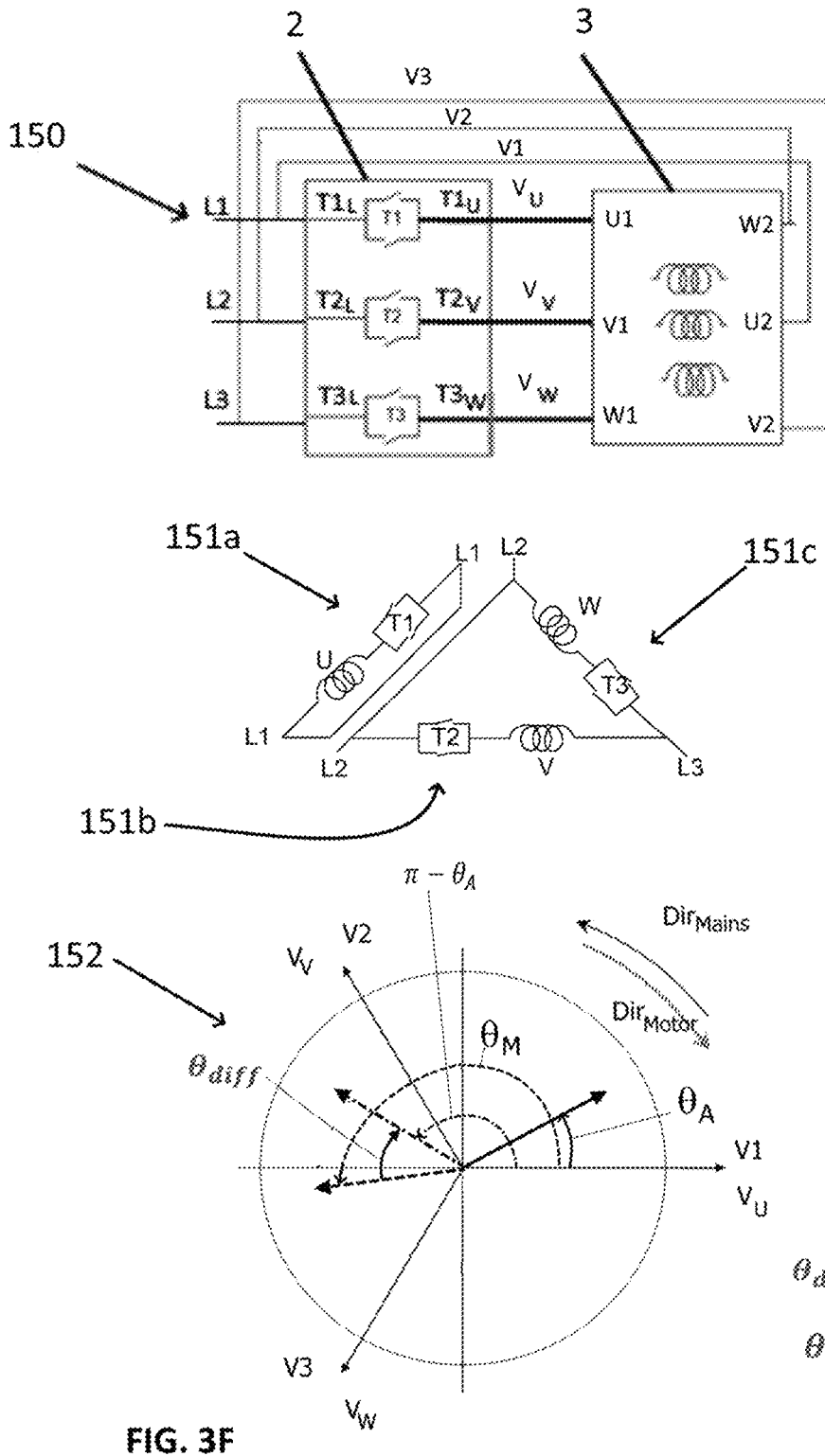

A third one winding looped back on itself configuration d) where the branch (U$_M$, T1) 151a is looped back on itself is described in FIG. 3F. In such configuration as per the cabling schematic 150, the branch (V$_M$, T2) 151b is connected to L2, L3, the branch (W$_M$, T3) 151c is connected between phases L3 and L2 and the branch (U$_M$, T1) 151a is looped back on itself and connected to phase L3.

In such case, the diagram 152 provides also reverse rotation direction between the motor R$_M$ and the power supply R$_A$. The differential angle between the electrical motor rotation angle motor and the Mains rotation angle $\theta_{mains}$ is then as in 153:

$$\theta_{diff} = \frac{\pi}{3}$$

Then as can be seen, the measurement of the differential angle between the electrical motor rotation angle and the Mains rotation angle allows to detect a wrong cabling and tell the user which of the connections line is/are not correct.

The diagnostic function can be launched by the customer or test person when the wiring in finished and after power up of the power supply 4.

The diagnostic function may also be launched at each startup, to protect the motor and avoid overcurrent fault which can stress the thyristor and trip the protections before the soft starter device.

Thanks to the diagnostic, it is also possible to check that the direction of rotation of the motor corresponds to the rotation direction of the Mains phases in case there is no inversion of cable between the output of starter T1U, T2V and T3W and the motor U1, V1, W1.

In addition, by connecting the Mains in the correct order, L1, L2, L3 respectively connected to U$_1$, V$_1$, W$_1$ through the thyristors of the starter 2, the customer can easily know the direction of rotation of the correctly wired motor as seen hereunder.

Figure 4A:
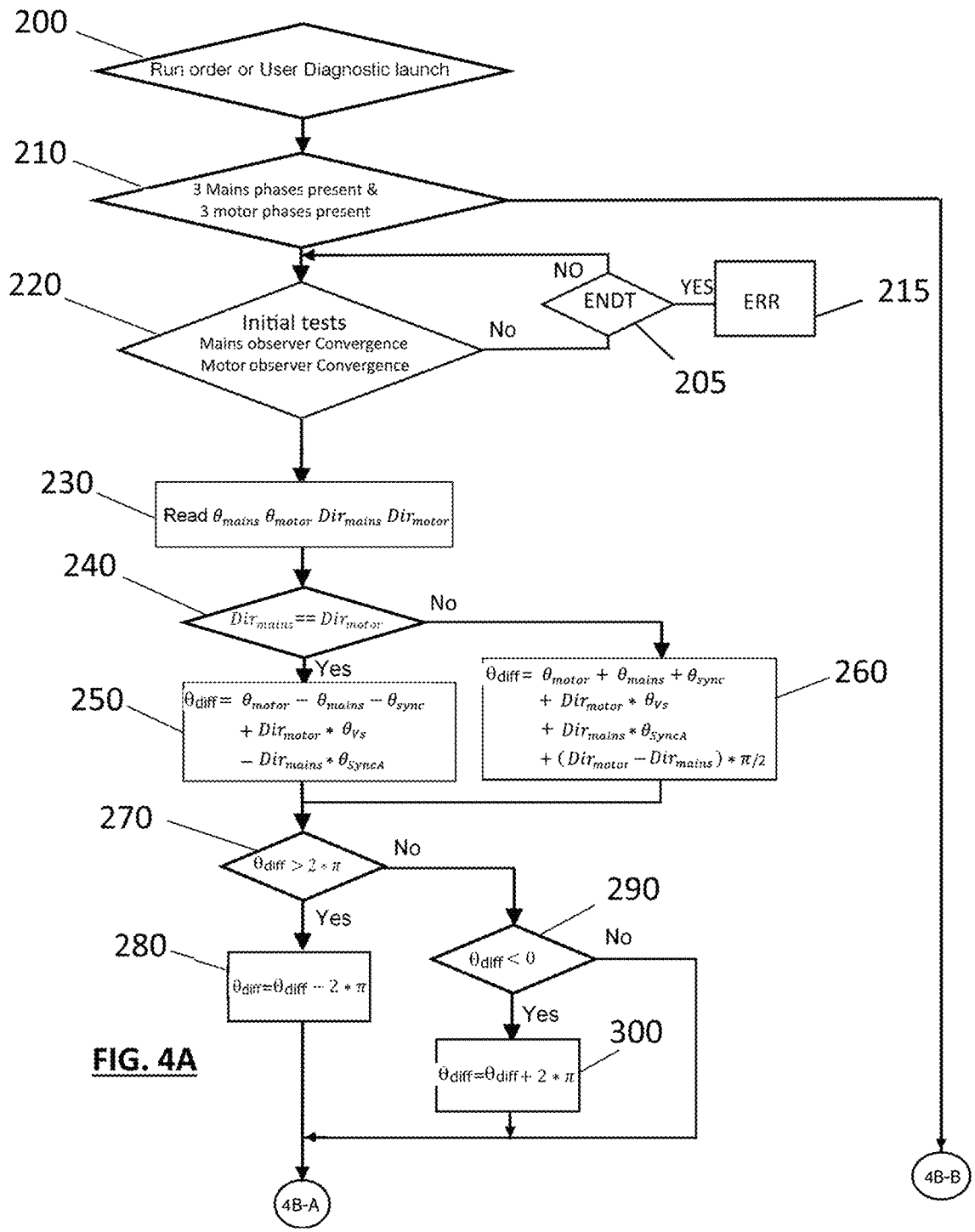
FIGS. 4A and 4B: show an exemplary flowchart of a process in accordance with the present disclosure.

The diagnostic process comprises, as exemplified in the flowchart of FIG. 4A, from a starting point 200 which is a diagnostic launch command or a run order for the motor: 000

A first test 210 is done to ensure that three Mains voltages V1, V2, V3 with expected dephasing between each three Mains voltages and that and three motor voltages V$_U$, V$_V$, V$_W$ are present with expected dephasing between each three voltages. If it is not the case a warning "Bad Mains/Motor" is issued at step 410 of FIG. 4B to specify to the user that the diagnostic or run order cannot be launched until the Mains or the motor are not connected (each of the six Mains and motor phases have to be connected to one connection point).

If the result of the test 210 is correct, a further test 220 on the Mains and Motor frequency and on the phase observer (sometimes called PLL function) convergence ("MainsPObserverConverg;" MotorPObserverConverg") is lead in order to ensure computing $\theta_{diff}$ with correct $\theta_{mains}$ and $\theta_{motor}$ values. The observer convergence test consist in verifying that the observer error is below a certain threshold.

At the end of this test, if one of the test results is negative, the sequence is started again unless and end of temporisation ENDT 205 is reached such end of temporisation 215 issuing and error ERR.

The convergence of the observers is correct, a step 230 of reading of the values of $\theta_{mains}$ Mains angle, $\theta_{motor}$ motor angle, $\text{Dir}_{mains}$, direction of rotation of the Mains, $\text{Dir}_{motor}$ direction of rotation of the motor by the soft starter processor 21 is done.

A test on the motor rotation angle versus Mains rotation angle is then done at step 240.

In case the Mains rotation direction $\text{Dir}_{mains}$ is equal to the motor rotation direction $\text{Dir}_{motor}$, the equation:

$$\theta_{diff} = \theta_{motor} - \theta_{mains} - \theta_{sync} + \text{Dir}_{motor} \times \theta_{Vs} - \text{Dir}_{mains} \times \theta_{syncA}$$

is calculated at step 250 where $\theta_{sync}$ is the observer angle delay and where $\theta_{syncA}$ is the delay introduced by the Mains Voltage sign measurement hardware and $\theta_{Vs}$ is the delay introduced by the Motor Voltage sign measurement hardware in the soft starter processor when the voltage measurement is limited to the sign of the voltage.

- $\text{Dir}_{motor} = 1$ when the three motor voltage phases rotate in direct direction and
- $\text{Dir}_{motor} = -1$ when they rotate in reverse direction;
- $\text{Dir}_{mains} = 1$ when the three Mains voltage phases rotate in direct direction and
- $\text{Dir}_{mains} = -1$ when they rotate in reverse direction.

In case the motor rotation direction $\text{Dir}_{motor}$ is reversed with respect to the Mains rotation direction $\text{Dir}_{mains}$, the equation:

$$\theta_{diff} = \theta_{motor} + \theta_{mains} + \theta_{sync} + \text{Dir}_{motor} \times \theta_{Vs} + \text{Dir}_{mains} \times \theta_{SyncA} + \frac{(\text{Dir}_{motor} - \text{Dir}_{mains})}{2} \times \pi$$

is calculated at step 260.

Here also:
- $\text{Dir}_{motor} = 1$ when the three motor voltage phases rotate in direct direction and
- $\text{Dir}_{motor} = -1$ when they rotate in reverse direction;
- $\text{Dir}_{mains} = 1$ when the three Mains voltage phases rotate in direct direction and
- $\text{Dir}_{mains} = -1$ when they rotate in reverse direction.

After calculation of $\theta_{diff}$, a test $$\theta_{diff} > 2 \times \pi$$

Is done at step 270 and if the result is positive, $\theta_{diff}$ is made equal to $\theta_{diff} - 2 \times \pi$ at step 280. If the result is negative, a further test $\theta_{diff} < 0$ is done at step 290 which allows, in case $\theta_{diff}$ is negative, to calculate $\theta_{diff} = \theta_{diff} + 2 \times \pi$ at step 300 and in case $\theta_{diff}$ is positive to keep $\theta_{diff}$ as is.

Figure 4B:
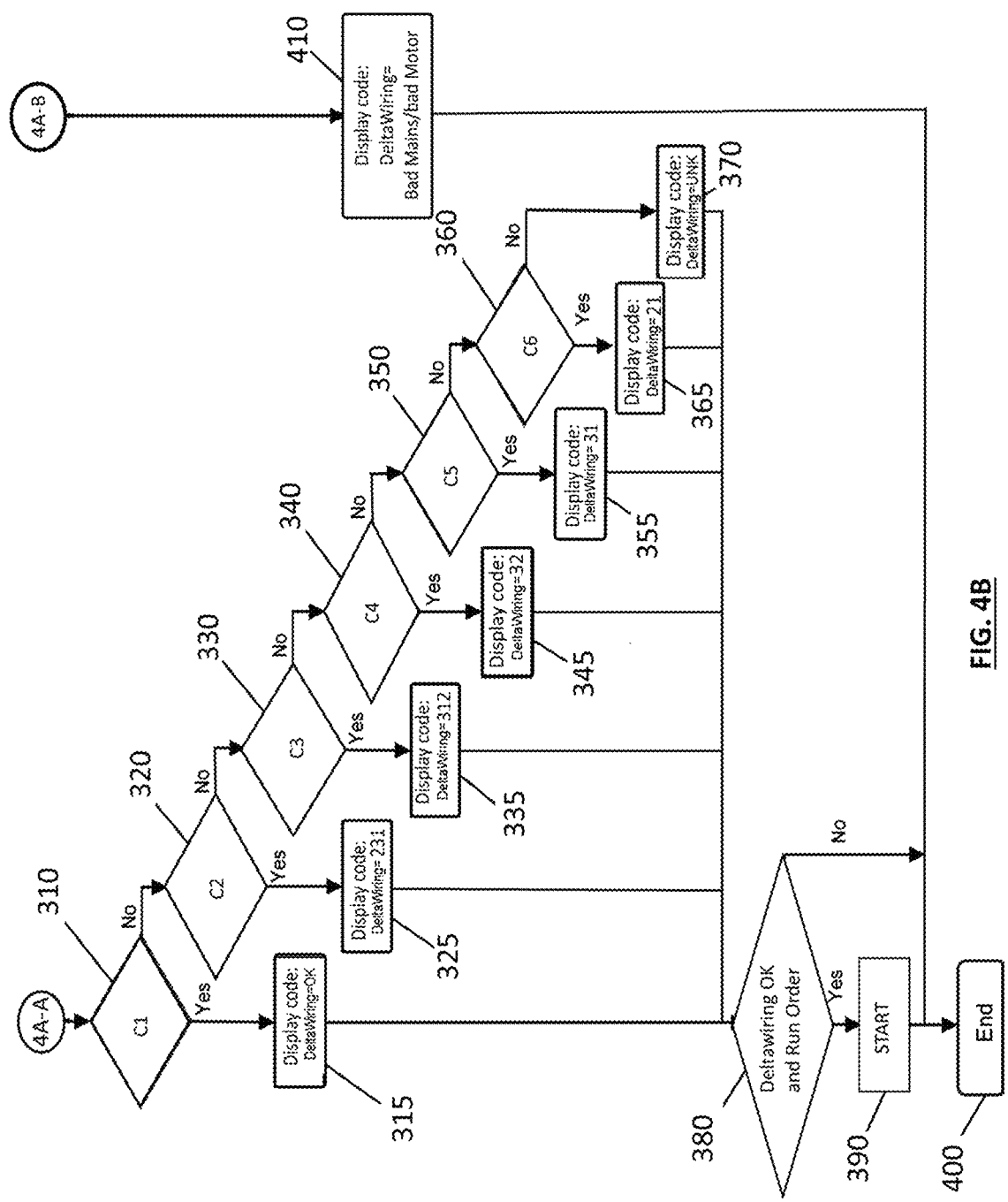

The exemplified process is disclosed further in FIG. 4B where several tests are done on $\theta_{diff}$ to determine the state of the wiring.

The test sequence is shown in a specific order but may be done in a different order.

In test 310 the first condition C1:

$$\frac{4\pi}{3} - \varepsilon < \theta_{diff}$$

and $$\theta_{diff} < \frac{4\pi}{3} + \varepsilon$$

is tested where $\varepsilon$ is a tolerance limit value which, as there is six possible values for $\theta_{diff}$, should have a maximal value of $$\frac{\pi}{6}$$

that is 30° as 360/6/2=30°. A minimum value of 10° for $\varepsilon$ may also be considered but for simplicity, $\varepsilon$ It is set at about $$\frac{\pi}{9}$$

that is 20° allowing to have ±20° angle tolerance around $\theta_{diff}$ exact value and 20° between each six 40° zones.

If the first condition is satisfied, as in FIG. 3A, a display code Deltawiring=OK is displayed at 315 and the test 380 on the presence of a run order in the correct delta wiring condition is done to start the motor at 390 in case a run order ant the wiring is OK are detected.

If the first condition is not satisfied, a second test on the second condition C2:

$$\frac{2\pi}{3} - \varepsilon < \theta_{diff}$$

and $$\theta_{diff} < \frac{2\pi}{3} + \varepsilon$$

is done at step 320.

If the second condition is satisfied, as in FIG. 3B, a display code Deltawiring=231 for a reverse cabling 2-3-1 is emitted at step 325.

If the second condition is not satisfied, a third test on a third condition condition C3:

$$0 - \varepsilon < \theta_{diff}$$

and $$\theta_{diff} < 0 + \varepsilon$$

Is done at step 330.

If such third condition is satisfied, a display code Deltawiring=312 for a reverse cabling 3-1-2 corresponding to all windings looped back on themselves situation of FIG. 3C is emitted at step 335.

If such third condition is not satisfied, a fourth test on a fourth condition C4:

$$\frac{5\pi}{3} - \varepsilon < \theta_{diff}$$

and $$\theta_{diff} < \frac{5\pi}{3} + \varepsilon$$

Is done at step 340.

If such fourth condition is satisfied, a display code DeltaWiring=32 for the winding V looped back on itself, as in FIG. 3D, is emitted.

If such fourth condition is not satisfied a fifth test on a fifth condition C5:

$$\pi - \varepsilon < \theta_{diff}$$

and $\theta_{diff} < \pi + \varepsilon$ is done at step 350.

If such fifth condition is satisfied a display code DeltaWiring=31 for a winding W looped back on itself, as in FIG. 3E is emitted.

If such fifth condition is not satisfied a sixth test on a sixth condition C6:

$$\frac{\pi}{3} - \varepsilon < \theta_{diff}$$

and $$\theta_{diff} < \frac{\pi}{3} + \varepsilon$$

is done at step 360.

If this sixth and last condition is satisfied a display code DeltaWiring=21 for a winding U looped back on itself, as in FIG. 3F, is emitted.

If not a display code DeltaWiring=UNK for unknown cabling is emitted at step 370.

All positive test return to step 380 where is tested the presence of a run order in the correct delta wiring condition. It should be noted that a fixed ε is chosen for simplicity but ε could also be variable.

The test sequence is then easily made with the only request of powering the Mains three phases and the soft starter device.

The Delta Wiring codes "DeltaWiring" are only illustrative and may be changed or replaced by detailed explanations on the errors found in case a large display connected to the soft starter device permits to provide explanations and possibly guidance for correcting the defects.

Figure 5:
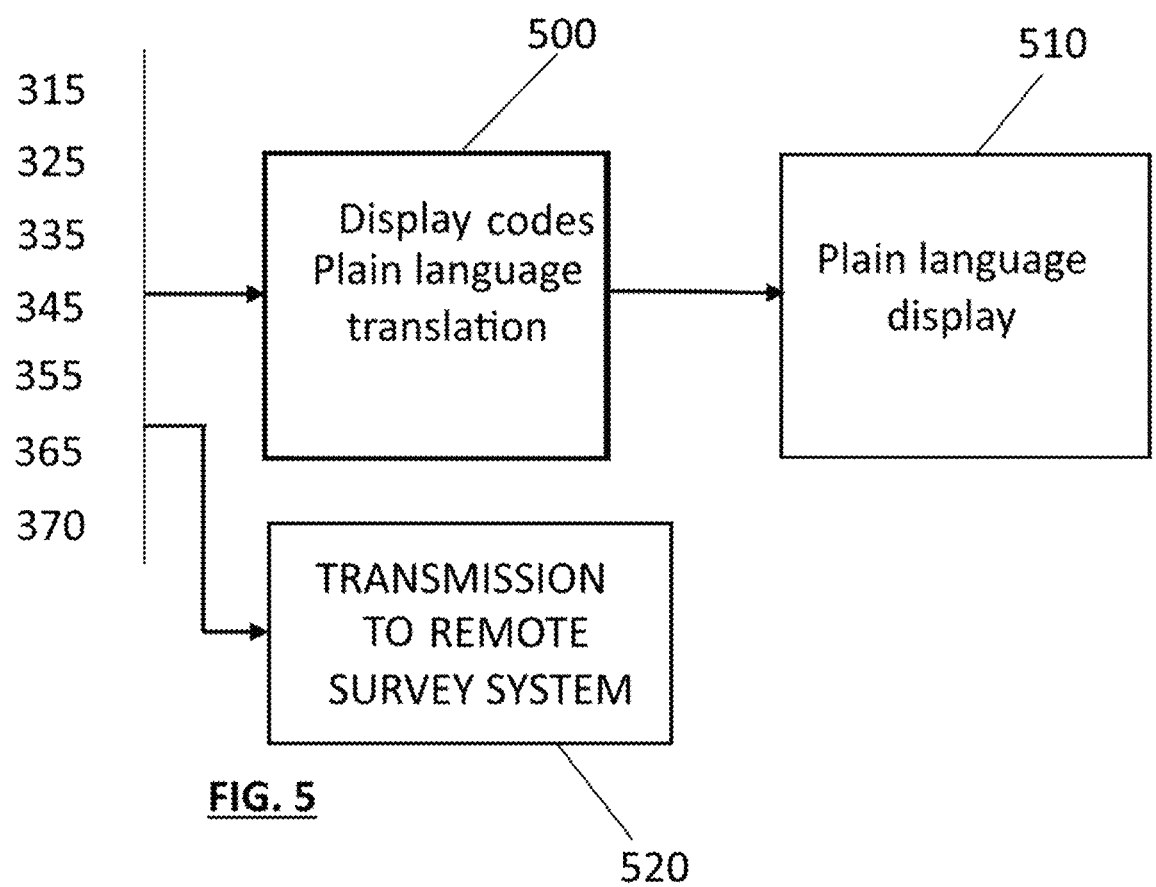
FIG. 5: shows a flowchart of possible additional steps of the disclosed process.

FIG. 5 provides additional optional steps of translating 500 the display codes in plain language messages, displaying such plain language messages 510 and transmitting 520 the display codes to a remote survey system such as device 1 having a display 12 in FIG. 1.

The scope of protection of the invention is defined by the hereunder claims. The hereabove description is only illustrative and as said before, the test sequence can be run after cabling the system to complete the quality controls but can also be launched when a start order is emitted prior to running the motor in order to confirm that the circuit is correct. In addition, the order of the tests in the test sequence may be modified.

The invention claimed is:

1. A diagnostic process for detecting errors in a cabling of a three phase motor in a "delta-inside" configuration with a soft starter to a three phases power supply, comprising,
    after cabling a soft starter with the thyristor outputs of the soft starter to the motor windings inputs, cabling the motor windings outputs to the main phases and powering the power supply or prior to startup of the motor, at least a test process comprising:
    at least measuring, with voltage sensors connected to the Mains inputs of the soft starter, with voltage sensors connected to the motor outputs of the thyristors of the soft starter and with observer means within the soft starter, the voltages or sign of the voltages and phase angles of the Mains and motor lines at the soft starter output in order to compare such voltages or sign of the voltages and phase angles without triggering said thyristors,
    at least calculating the differential angle $\Delta\theta$ between the motor electric rotation angle $\theta_{motor}$ on the output side of the soft starter and the Mains electric rotation angle $\theta_{mains}$,
    at least comparing the calculated differential angle $\theta_{diff}$ with known differential angles corresponding to a correct cabling differential angle and faulty cablings differential angles in a sequence of tests to determine the status of the cabling,
    and wherein results of the test process are displayed to show the status of said cabling.

2. The diagnostic process according to claim 1 wherein, upon detection of a correct cabling, a test of presence of a run order is provided in order to permit to start the motor.

3. The diagnostic process according to claim 1, wherein in case $\text{Dir}_{mains}$, the Mains voltage rotation direction, is equal to the motor rotation direction $\text{Dir}_{motor}$ then $$\theta_{diff} = \theta_{motor} - \theta_{mains} - \theta_{sync} + \text{Dir}_{motor} \times \theta_{V_S} - \text{Dir}_{mains} \times \theta_{syncA}$$

where $\theta_{sync}$ is an observer angle delay and where $\theta_{syncA}$ is a Mains Voltage sign hardware measurement delay and $\theta_{V_S}$ is a Motor Voltage sign hardware measurement delay introduced when the voltage measurement is limited to the sign of the voltage, where $\text{Dir}_{motor}=1$ when the three motor voltage phases rotate in direct direction and $\text{Dir}_{motor}=-1$ when said motor phase voltages rotate in reverse direction and where $\text{Dir}_{mains}=1$ when the three Mains voltage phases rotate in direct direction and $\text{Dir}_{mains}=1$ when they rotate in reverse direction.

4. The diagnostic process according to claim 1, wherein in case $\text{Dir}_{mains}$, the Mains voltage rotation direction, is not equal to the motor rotation direction $\text{Dir}_{motor}$ then $$\theta_{diff} = \theta_{motor} + \theta_{mains} + \theta_{sync} + \text{Dir}_{motor} \times \theta_{V_S} + \text{Dir}_{mains} \times \theta_{SyncA} + \frac{(\text{Dir}_{motor} - \text{Dir}_{mains})}{2} \times \pi$$

where $\theta_{sync}$ is an observer angle delay and where $\theta_{syncA}$ is a Mains Voltage sign hardware measurement delay and $\theta_{V_S}$ is a Motor Voltage sign hardware measurement delay introduced when the voltage measurement is limited to the sign of the voltage, where $\text{Dir}_{motor}=1$ when the three motor voltage phases rotate in direct direction and $\text{Dir}_{motor}=-1$ when said motor phase voltages rotate in reverse direction and where $\text{Dir}_{mains}=1$ when the three Mains voltage phases rotate in direct direction and $\text{Dir}_{mains}=1$ when they rotate in reverse direction.

5. The diagnostic process according to claim 3, wherein said sequence of tests is done on the value $\theta_{diff}$ to determine the status of the cabling and wherein said results comprise diagnostic codes according to the determination of such status of the cabling.

6. The diagnostic process according to claim 5 wherein a first test of said sequence comprises checking whether a first condition C1 where $\theta_{diff}$ is greater than $$\frac{4\pi}{3} - \varepsilon$$

and lower than $$\frac{4\pi}{3}+\varepsilon$$

is satisfied, wherein, in case the result of such first test is positive, a display code for a correct wiring is emitted and a motor run order is executed when present, and wherein in case the result of such first test is negative a further test is executed or in case the firth test is the last test of the test sequence a display code wiring unknown is emitted.

7. The diagnostic process according to claim 5 wherein a second test of said sequence comprises checking whether a second condition C2 where $\theta_{diff}$ is greater than $$\frac{2\pi}{3}-\varepsilon$$

and lower than $$\frac{2\pi}{3}+\varepsilon$$

is satisfied, wherein, in case the result of said second test is positive a display code for a first reversed triangle condition is emitted and the process is stopped an wherein in case the result is negative a further test is executed or in case the second test is the last test of the test sequence a display code wiring unknown is emitted.

8. The diagnostic process according to claim 5 wherein a third test of said sequence comprises checking whether a third condition C3 where $\theta_{diff}$ is greater than 0−ε and lower than 0+ε is satisfied, wherein in case the result of said third test is positive a display code for a second reversed triangle condition is emitted and the process is stopped an wherein in case the result is negative a further test is executed or in case the third test is the last test of the test sequence a display code wiring unknown is emitted.

9. The diagnostic process according to claim 5 wherein a fourth test of said sequence comprises checking whether a fourth condition C4 where $\theta_{diff}$ is greater than $$\frac{5\pi}{3}-\varepsilon$$

and lower than $$\frac{5\pi}{3}+\varepsilon$$

is satisfied, wherein in case the result of said fourth test is positive a display code for a winding V looped back on itself is emitted and the process is stopped an wherein in case the result is negative a further test is executed or in case the fourth test is the last test of the test sequence a display code wiring unknown is emitted.

10. The diagnostic process according to claim 5 wherein a fifth test of said sequence comprises checking whether a fifth condition C5 where $\theta_{diff}$ is greater than π−ε and lower than π+ε is satisfied, wherein in case the result of said fifth test is positive a display code for a winding W looped back on itself is emitted and the process is stopped an wherein in case the result is negative a further test is executed or in case the fifth test is the last test of the test sequence a display code wiring unknown is emitted.

11. The diagnostic process according to claim 5 wherein a sixth test of said sequence comprises checking whether a sixth condition C6 where $\theta_{diff}$ is greater than $$\frac{\pi}{3}-\varepsilon$$

and lower than $$\frac{\pi}{3}+\varepsilon$$

is satisfied, wherein in case the result of said fifth test is positive a display code for a looped back on itself winding U is emitted and the process is stopped an wherein in case the result is negative a further test is executed or in case the sixth test is the last test of the test sequence a display code wiring unknown is emitted.

12. The diagnostic process according to claim 5 wherein ε is set between $$3*\frac{\pi}{18} \text{ and } \frac{\pi}{18}$$

allowing to have between ±30° and 10° angle tolerance around $\theta_{diff}$ and preferably $$\frac{\pi}{9}.$$

13. The diagnostic process according to claim 1, comprising at least one of:
  displaying at least one of said display codes;
  translating said display codes into plain language explanations and displaying said plain language explanations:
  transferring said results to a remote survey system or remote control device provided with display means for displaying said status of said cabling.

14. A soft starter device comprising a processor, Mains voltage sensors on Mains inputs of motor control thyristors, motor voltage sensors on motor outputs of said thyristors, analog to digital conversion means associated to the processor for measuring the Mains phases voltages and the motor phase voltages, first observer means for measuring the Mains phases rotation angle, second observer means for measuring the motor phases rotation angle, said processor being further configured for implementing the diagnostic process of claim 1 upon receipt of a test order from a remote control device or upon receipt of a start order for the motor.

15. A non-transitory computer readable medium comprising a software program stored thereon for performing at least the diagnostic process of claim 1 when executed by a processor.

* * * * *